(12) United States Patent
Ejvinsson et al.

(10) Patent No.: US 8,326,108 B2
(45) Date of Patent: Dec. 4, 2012

(54) MODULAR NETWORK CONNECTION EQUIPMENT

(75) Inventors: Peter Ejvinsson, Stockholm (SE); Jakob Bioje, Stockholm (SE); Viktor Holmqvist, Vällingby (SE); Hans Nyström, Vällingby (SE); Jonathan Young, Stockholm (SE); Rickard Gustavsson, Uplands Vasby (SE); Ola Skogsfors, Spanga (SE); Niclas Sonesson, Kista (SE); Stefan Tegenfalk, Kista (SE)

(73) Assignee: Genexis Holding B.V., Eindhoven (NL)

( * ) Notice: Subject to any disclaimer, the term of this patent is extended or adjusted under 35 U.S.C. 154(b) by 381 days.

(21) Appl. No.: 12/517,728

(22) PCT Filed: Dec. 6, 2007

(86) PCT No.: PCT/EP2007/063467
§ 371 (c)(1),
(2), (4) Date: Apr. 15, 2010

(87) PCT Pub. No.: WO2008/068316
PCT Pub. Date: Jun. 12, 2008

(65) Prior Publication Data
US 2010/0247050 A1    Sep. 30, 2010

(30) Foreign Application Priority Data

Dec. 6, 2006 (EP) .................................... 06125497

(51) Int. Cl.
*G02B 6/00* (2006.01)
*H05K 13/00* (2006.01)

(52) U.S. Cl. ............. 385/135; 385/134; 385/92; 29/825
(58) Field of Classification Search .................... 385/53, 385/124, 135, 88, 89, 92, 93, 94, 100, 24; 29/825

See application file for complete search history.

(56) References Cited

U.S. PATENT DOCUMENTS 5,689,598 A * 11/1997 Dean et al. ...................... 385/59
5,802,042 A    9/1998 Natarajan et al.
(Continued)

FOREIGN PATENT DOCUMENTS

EP    1 039 698    9/2000
(Continued)

OTHER PUBLICATIONS

Bodzinga, Anne, et al., "Interworking IPTV Services with IMS", Telecommunications Network Strategy and Planning Symposium 2006 pp. 1-5.
(Continued)

*Primary Examiner* — Brian Healey
(74) *Attorney, Agent, or Firm* — Faegre Baker Daniels LLP

(57) ABSTRACT

An apparatus for connecting user equipment to a broadband network includes a chassis having attachment points for connection to a supporting surface and a guide that permits entry of a communication cable. A cable termination unit may be mounted on the chassis such that a cable that is led through the guide can be connected and provided with a termination to which functional connections can be made. A cover may be mounted on the chassis in such a way as to be removable and reattachable to allow access to the chassis. The chassis may include mounting points for connecting at least one functional module to the communication cable and for allowing different communication functions to be provided to user equipment that is connected to the network via the apparatus.

18 Claims, 9 Drawing Sheets

U.S. PATENT DOCUMENTS

| | | | |
|---|---|---|---|
| 5,832,503 | A | 11/1998 | Malik et al. |
| 5,913,037 | A | 6/1999 | Spofford et al. |
| 6,028,769 | A * | 2/2000 | Zurek ............................ 361/704 |
| 6,059,614 | A | 5/2000 | Shelby et al. |
| 6,222,852 | B1 | 4/2001 | Gandy |
| 6,393,472 | B1 | 5/2002 | Anerousis et al. |
| 6,430,621 | B1 | 8/2002 | Srikanth et al. |
| 6,560,236 | B1 | 5/2003 | Varghese et al. |
| 6,680,945 | B1 | 1/2004 | Merchant et al. |
| 6,769,124 | B1 | 7/2004 | Schoening et al. |
| 6,876,667 | B1 | 4/2005 | Synnestvedt et al. |
| 6,885,657 | B1 | 4/2005 | Rabenko et al. |
| 7,054,309 | B1 | 5/2006 | Hoot et al. |
| 7,082,463 | B1 | 7/2006 | Bradley et al. |
| 7,099,158 | B1 | 8/2006 | Bjorklund |
| 7,139,818 | B1 | 11/2006 | Kinnear, Jr. et al. |
| 7,200,145 | B1 | 4/2007 | Edsall et al. |
| 7,218,827 | B2 * | 5/2007 | Vongseng et al. ............. 385/135 |
| 7,760,984 | B2 * | 7/2010 | Solheid et al. ................ 385/135 |
| 7,801,133 | B2 | 9/2010 | Siegel |
| 7,826,463 | B2 | 11/2010 | Patel et al. |
| 7,969,880 | B2 | 6/2011 | Yano et al. |
| 7,983,190 | B2 | 7/2011 | Hirota |
| 7,990,994 | B1 | 8/2011 | Yeh et al. |
| 2002/0023174 | A1 | 2/2002 | Garrett et al. |
| 2002/0075844 | A1 | 6/2002 | Hagen |
| 2002/0161801 | A1 | 10/2002 | Hind et al. |
| 2003/0039249 | A1 | 2/2003 | Basso et al. |
| 2003/0056225 | A1 | 3/2003 | Bione |
| 2003/0131107 | A1 | 7/2003 | Godse et al. |
| 2003/0165140 | A1 | 9/2003 | Tang et al. |
| 2003/0200285 | A1 | 10/2003 | Hansen et al. |
| 2003/0206548 | A1 | 11/2003 | Bannai et al. |
| 2004/0017829 | A1 | 1/2004 | Gray et al. |
| 2004/0047353 | A1 | 3/2004 | Umayabashi et al. |
| 2004/0049568 | A1 | 3/2004 | Nguyen et al. |
| 2004/0090965 | A1 | 5/2004 | Lin |
| 2004/0172412 | A1 | 9/2004 | Files et al. |
| 2004/0213152 | A1 | 10/2004 | Matuoka et al. |
| 2004/0258074 | A1 | 12/2004 | Williams et al. |
| 2005/0049886 | A1 | 3/2005 | Grannan et al. |
| 2005/0129379 | A1 * | 6/2005 | Reagan et al. ................. 385/135 |
| 2005/0281526 | A1 * | 12/2005 | Vongseng et al. ............. 385/135 |
| 2005/0286517 | A1 | 12/2005 | Babbar et al. |
| 2006/0026228 | A1 | 2/2006 | Kim |
| 2006/0261116 | A1 | 11/2006 | Brandeis |
| 2006/0277603 | A1 | 12/2006 | Kelso et al. |
| 2007/0058638 | A1 | 3/2007 | Guichard et al. |
| 2007/0168547 | A1 | 7/2007 | Krywaniuk |
| 2007/0174522 | A1 | 7/2007 | Lee |
| 2007/0203999 | A1 | 8/2007 | Townsley et al. |
| 2007/0286198 | A1 | 12/2007 | Muirhead et al. |
| 2008/0219281 | A1 | 9/2008 | Akin et al. |
| 2010/0247050 | A1 * | 9/2010 | Ejvinsson et al. ............. 385/135 |
| 2011/0161360 | A1 | 6/2011 | Lundstrom |

FOREIGN PATENT DOCUMENTS

| | | |
|---|---|---|
| EP | 1780941 | 5/2007 |
| GB | 2 069 767 | 1/1981 |
| JP | 3094495 | 4/1991 |
| KR | 2001/0038481 | 5/2001 |
| WO | WO 2000/060864 | 10/2000 |
| WO | WO 2002/035797 | 5/2002 |
| WO | WO 2008/068316 | 6/2008 |
| WO | WO 2008/113852 | 9/2008 |
| WO | WO 2008/113854 | 9/2008 |
| WO | WO 2009/019300 | 2/2009 |
| WO | WO 2009/027513 | 3/2009 |
| WO | WO 2009/035719 | 3/2009 |
| WO | WO 2009/047215 | 4/2009 |
| WO | WO 2009/047334 | 4/2009 |
| WO | WO 2009/047345 | 4/2009 |

OTHER PUBLICATIONS

International Search Report and Written Opinion for PCT/EP2008/053369, mailed Jul. 2, 2008, 10 pages.

International Search Report and Written Opinion for PCT/EP2008/060384, mailed Nov. 11, 2008, 10 pages.

International Search Report and Written Opinion for PCT/EP2008/061403, mailed Dec. 18, 2008, 12 pages.

International Search Report for PCT/EP2008/053374, mailed Sep. 25, 2009, 3 pages.

International Search Report and Written Opinion for PCT/EP2008/056563, mailed Aug. 21, 2008, 11 pages.

International Search Report for PCT/EP2008/063667, mailed Jul. 30, 2009, 3 pages.

International Search Report for PCT/EP2008/063639, mailed Oct. 1, 2009, 2 pages.

International Search Report for PCT/EP2008/063270, mailed Jan. 21, 2009, 3 pages.

International Search Report and Written Opinion for PCT/EP2008/056565, mailed Jan. 19, 2009.

European Search Report issued in EP Application 07104707, Publication 1973269, dated Aug. 27, 2007, 7 pages.

European Search Report issued in EP Publication 1931085, mailed Jan. 9, 2009, 8 pages.

International Search Report for PCT/EP2007/063467, mailed Apr. 3, 2008, 2 pages.

* cited by examiner

MODULAR NETWORK CONNECTION EQUIPMENT

TECHNICAL FIELD

This invention relates to a modular apparatus for installation in a customer's premises and for connection to a network. The invention is particularly applicable to use with broadband networks such as triple-play networks.

BACKGROUND ART

In triple-play networks, a single network connection is used to provide voice (telephony), internet and TV connectivity. A single cable, often an optical cable is run to a customer's premises, e.g. a house, apartment, etc., and the customer then attaches suitable equipment (telephones, TV sets, computers, etc.) to this single connection. Such networks are becoming more common, especially in newer housing developments where the need to provide separate telephone, cable TV and Internet connections can be avoided.

In such networks, a cable is run to the customer's premises and connected to equipment that provides the functional connection for the various devices. This equipment is often known generically as 'customer premise equipment' or 'CPE'. More specifically, as the equipment involves a switch function, it can be know as 'customer premise switch' or CPS.

In its simplest form, the cable connection to the customer premises is just that, a simple cable run into the premises. As many of the cable used are fragile, and to avoid hazard risks, termination units are often provided to secure the customer end of the cable. Where the cable is a fibre optic cable, these units are know as 'fibre termination units' or 'FTUs'. In their simplest form, termination units are merely mechanical devices that secure the end of the fibre to a surface such as a wall, and provide a connector into which the fibre is connected and onto which the customer can connect appropriate equipment. More sophisticated FTUs can include functional elements such as a cable TV module to convert TV signals on the fibre into a normal antenna signal that can be connected to a TV.

One example of a CPS used with an FTU is the CPS 300 of PacketFront Sweden.

The problem with current CPEs is that they are either equipped with all functional parts to allow all services to be provided and so expensive if only part of the services supported are taken, or are unable to support services that are taken or become available at a later date.

This invention seeks to provide an apparatus that allows progressive increase in functionality without the need to incur large up-front costs.

DISCLOSURE OF THE INVENTION

A first aspect of this invention provides apparatus for connecting user equipment to a broadband network, comprising:
   a chassis including attachment points for connection to a supporting surface and a guide to permit entry of a communication cable;
   a cable termination unit mounted on the chassis such that a cable lead though the guide point can be connected and provided with a termination to which functional connections can be made; and
   a cover that is mounted on the chassis and is removable and reattachable to allow access to the chassis;
   wherein the chassis also includes mounting points for at least one functional module for connection to the communication cable and allowing different communication functions to be provided to user equipment connected to the network via the apparatus.

By providing the chassis with the mounting points, it is possible to later add various modules as the required services are provided.

The functional module preferably comprises an uplink module to which further functional modules can connect for power and network connection so as to define a basic unit with the chassis, cover and cable termination unit. The further functional modules can comprise one or more of switch, voice over IP and wireless network modules.

The uplink module preferably includes a cable terminator, a converter for providing a signal input and output from and to the cable and converting between received cable signals and electrical network signals, and a power source.

The switch module which can be connected to the uplink module so as to be able to send and receive electrical network signals and receive power, and providing one or more ports for connection of network devices, a port for connection of the voice over IP module and a port for connection of the wireless network module.

The voice over IP and/or wireless network module can be connected to the switch module so as to be able to exchange network signals therewith and connected to the uplink module so as to receive power therefrom.

The chassis can comprise a base including an aperture defining the guide point through which the cable can enter and formations around which cable can be wound prior to being lead to the cable termination unit.

It is preferred that the formations comprise upstanding walls forming turning points and an outer wall to define a channel leading to the cable termination unit such that when the chassis is attached with the aperture over a cable exiting the supporting surface, cable in excess of that needed to extend between the aperture and the cable termination unit can be wound around the formations in the channel. The upper edge of the walls can comprise tabs extending laterally over the channel to assist in retaining the cable therein.

In a preferred embodiment, the cable termination unit comprises a first part for providing connection between an end fitting on the functional module and the cable, and a second part configured to guide the end fitting into the first part. The first part preferably includes a spring formation to allow lateral movement to accommodate the end fitting. The second part can comprise a guide formation shaped so as to be engageable in a corresponding slot in the end fitting to ensure alignment of the end fitting with the first part.

It is also preferred that the apparatus comprises magnetic connectors for mounting the further functional unit on the basic unit. In a particularly preferred embodiment, the magnetic connectors comprise magnets located in the further functional modules. The magnetic connectors can comprise inter-engaging shaped formations to hold the further functional module in place on the chassis. The mounting points can be located at the sides of the basic unit.

The basic unit can include a functional connector located near to the mounting points by which the further functional module connects to the cable. The connector typically comprises a socket in the basic unit into which a plug connector on the further functional module is inserted when the further functional module is held in place by the magnetic connectors.

A second aspect of the invention provides a method of providing a broadband network connection to a location, comprising:

(i) installing an apparatus as described above on a supporting surface at the location; and
(ii) connecting a broadband network cable though the guide in the chassis to the cable termination unit; wherein the method further comprises subsequently connecting at least one functional module on the chassis by means of the mounting points and connecting user equipment to the cable by means of the functional module.

When the chassis comprises a base including an aperture defining the guide point through which the cable can enter and formations around which cable can be wound, the method preferably comprises positioning the aperture over a cable exiting the support surface; leading the cable through the aperture; winding the cable around the formations and connecting the cable to the cable termination unit.

When the mounting points for the functional units comprise magnetic connectors for holding the further functional modules on the basic unit, the method preferably comprises connecting the further functional module to the basic unit by means of positioning the further functional module close to the basic unit such that the magnetic connectors act to attract the further functional module onto the basic unit and make a functional connection.

The method can also include optionally include removing the cover and installing an uplink module on the chassis, the uplink module including a cable terminator, a converter for providing a signal input and output from and to the cable and converting between received cable signals and electrical network signals, and a power source; connecting the cable to the uplink module; and replacing the cover on the chassis.

The method can also comprise the further steps of:
installing on the chassis a switch module providing one or more ports for connection of network devices, a port for connection of a voice over IP module and a port for connection of a wireless network module and connecting the switch module to the uplink module so as to be able to send and receive electrical network signals and receive power;
installing on the chassis a voice over IP module and connecting the voice over IP module to the switch module so as to be able to exchange network signals therewith and connected to the uplink module so as to receive power therefrom; and
installing on the chassis a wireless network module and connecting the wireless network module to the switch module so as to be able to exchange network signals therewith and connected to the uplink module so as to receive power therefrom.

These further steps can be performed at the same time as the installation of the uplink module or at any time thereafter. In particular the steps of installing the voice over IP and wireless network modules can be performed together or separately.

The invention also offers a new business model, comprising:
purchasing a basic apparatus and installing it in a location: and
subsequently purchasing the other modules as they are installed on the base unit.

Thus the up front cost to the user of the apparatus can be reduced, the cost of the functional parts only being incurred when the services they support are taken.

MODE(S) FOR CARRYING OUT THE INVENTION

Figure 1:
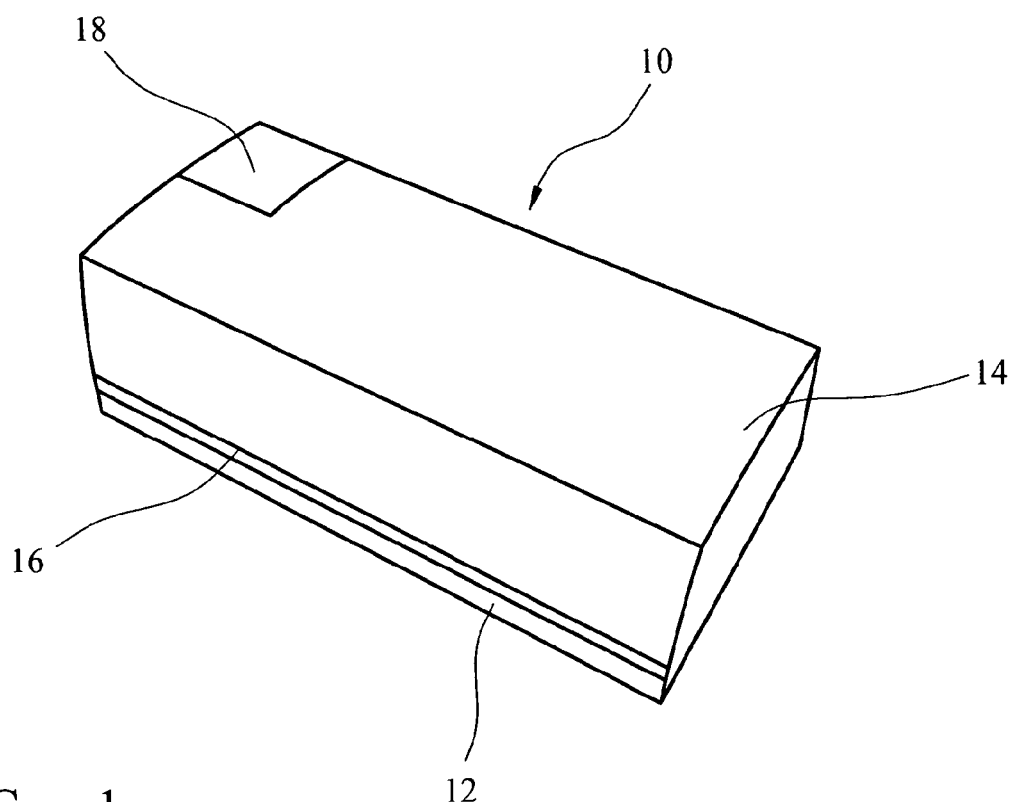
FIG. 1 shows one embodiment of a CPE according to the invention.

The apparatus shown in FIG. 1 comprises a CPE suitable for residential uses. It broadly comprises a base unit 10 comprising a chassis 12 that can be fixed to a wall (not shown), and a cover 14 that can be fixed to the chassis 12 to define a housing. The cover 14 can be removed to allow functional parts of the CPE to be installed as are discussed in more detail below.

Figure 2:
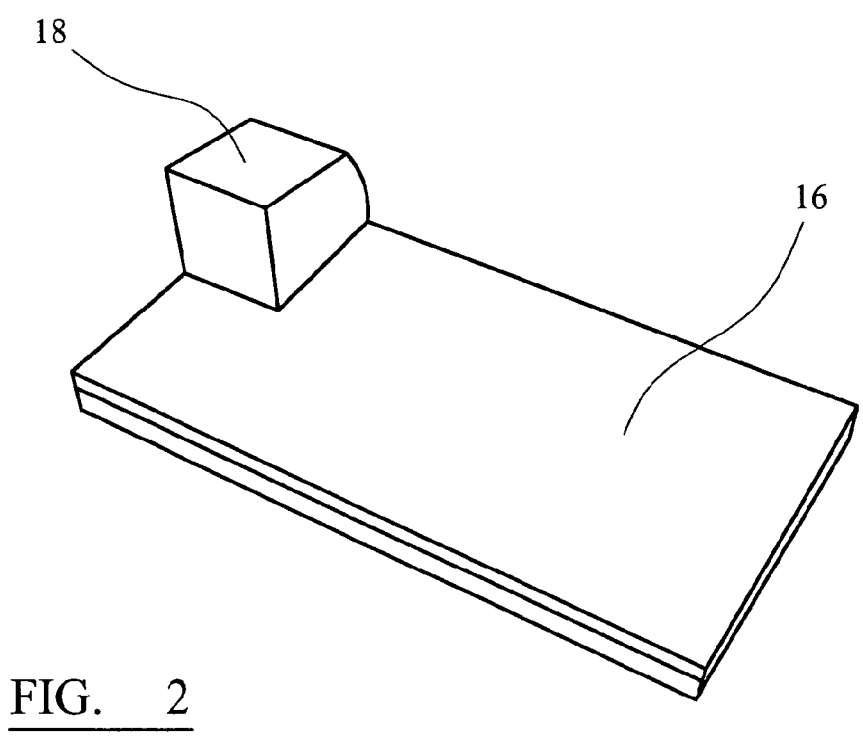
FIG. 2 shows the CPE of FIG. 1 with the cover removed.

The chassis comprises a fibre termination unit (FTU) 16 which provides a mechanical connection to which a network cable can be connected and which provides termination and a connection including a cover 18 to which other modules can be connected as shown in FIG. 2. While optical fibre is seen as the most common use for this apparatus, other network cable can also be accommodated. The chassis also comprises a number of mounting points into which other modules can be fitted.

In its simplest form, the base unit 10 comprises no electronic or electrical function but merely provides a mechanical location of the network cable entering the premises and protective covers 14, 18. Thus the base unit 10 can be made at relatively low cost and can be installed in all premises served by the network, whether or not any network service are provided. The chassis 12 and the covers 14, 18 provide physical protection for the end of the cable and a convenient location into which functional modules can be connected.

Figure 3:
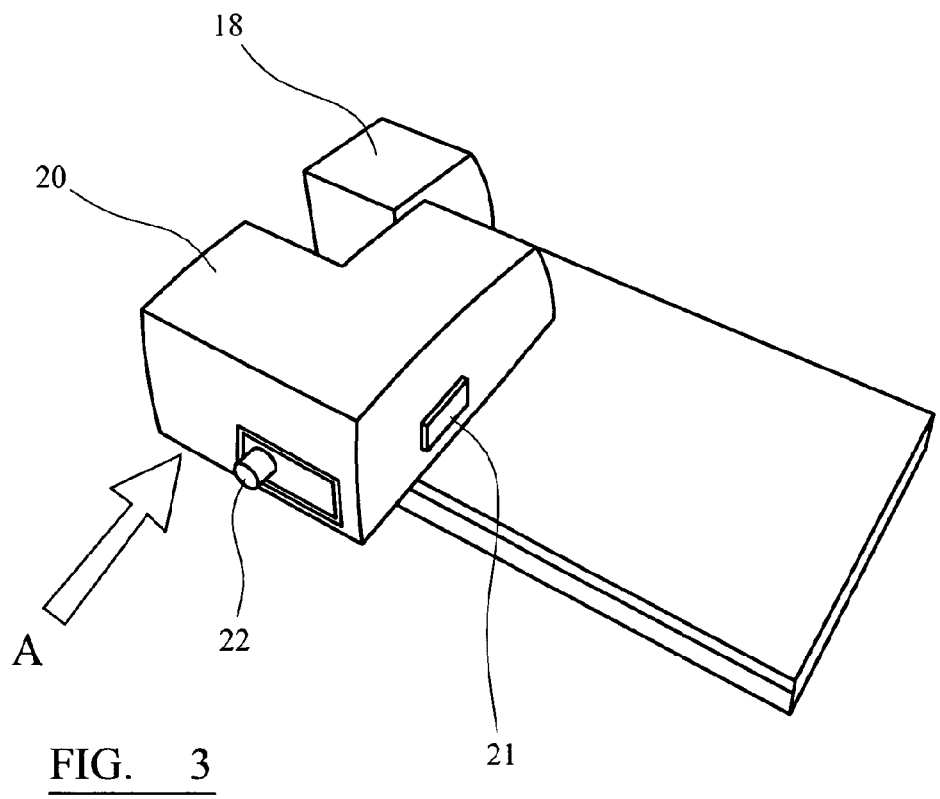
FIG. 3 shows the installation of an uplink module on the embodiment of FIG. 2.

The first functional module that must be connected to provide network functions is an uplink module 20 (sometimes called a 'managed media converter'). The uplink module 20 provides functional termination of the fibre and a converter to convert the optical signals on the fibre to electrical network signals such as Ethernet signals which can be provided on a standard Ethernet output connection 21. The uplink converter 20 is also provided with a power supply with a connector for connection to an electrical supply and, optionally, an RF overlay option that converts cable TV signals provided on the fibre to conventional TV antenna signals that can be provided by a conventional TV antenna output 22, and a standard telephone socket to which conventional telephone equipment can be connected. The uplink module 20 can also be provided with a power switch and LED indicators showing function and status of the device. The uplink module 20 is installed on the FTU 16 by removing the cover 14 and sliding the module 20 (arrow A of FIG. 3) into the fittings to connect to the FTU at the side of the cover 18.

Figure 4:
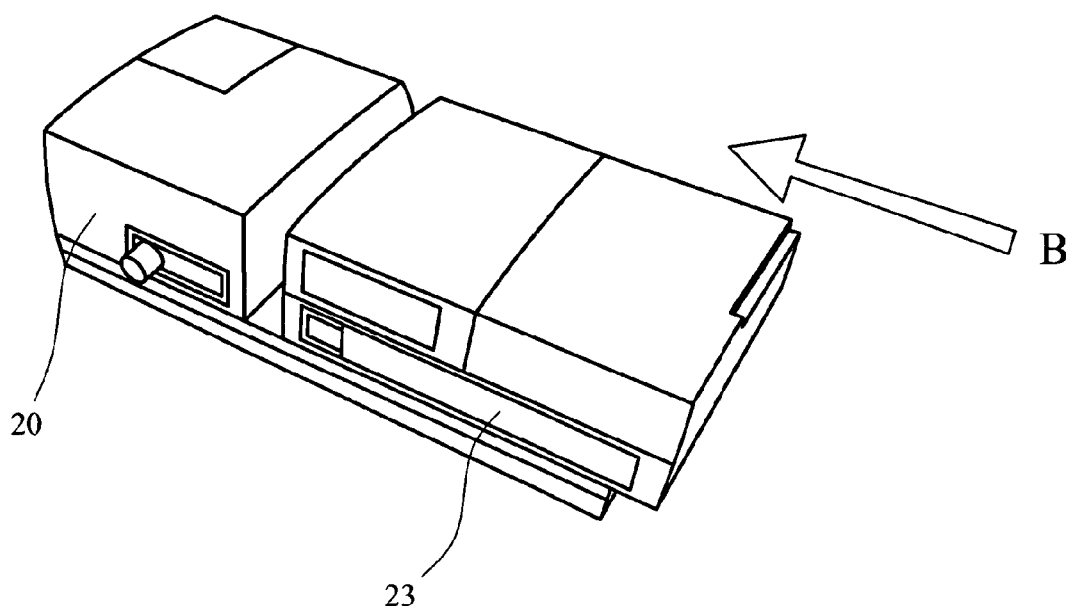
FIG. 4 shows the installation of an Ethernet card on the embodiment of FIG. 3.
Figure 5:
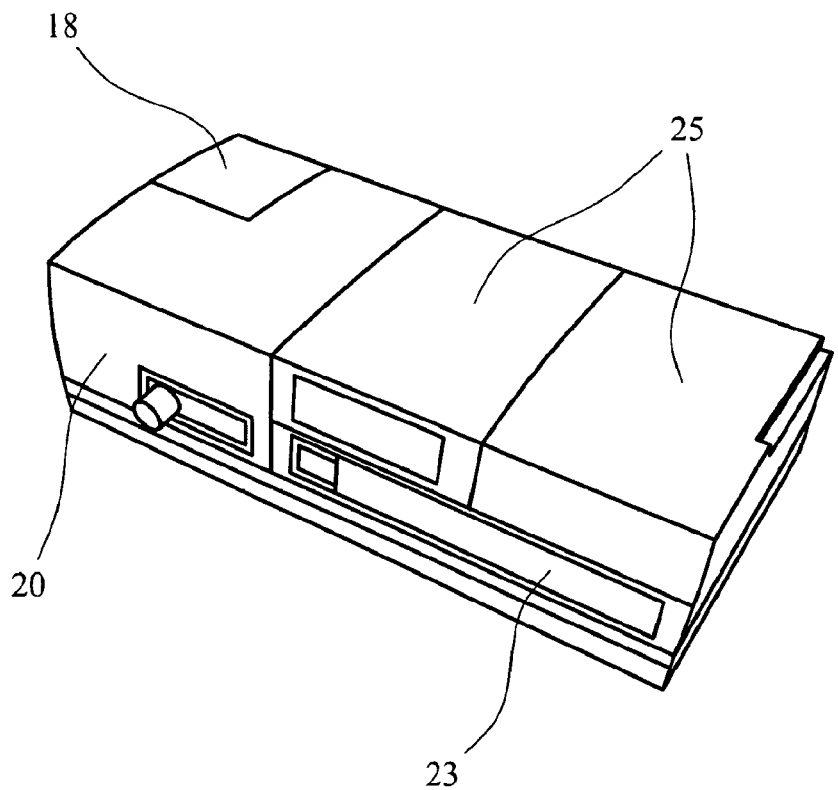
FIG. 5 shows the embodiment of the invention with both uplink module and Ethernet card and dummy modules installed.

The uplink module also provides connections to provide power and network connections for other functional modules to be housed in the base unit 10. A basic Ethernet card 23 can be connected to the uplink module 20 by sliding (arrow B of FIG. 4) to connect to the connector 21. Dummy modules 25 are provided on top of the Ethernet card 23 to complete the installation (FIG. 5).

With the uplink module 20 and the Ethernet card 23 installed, basic network services can be provided to the residence. However, further services can be enabled by adding further functional modules.

Figure 6:
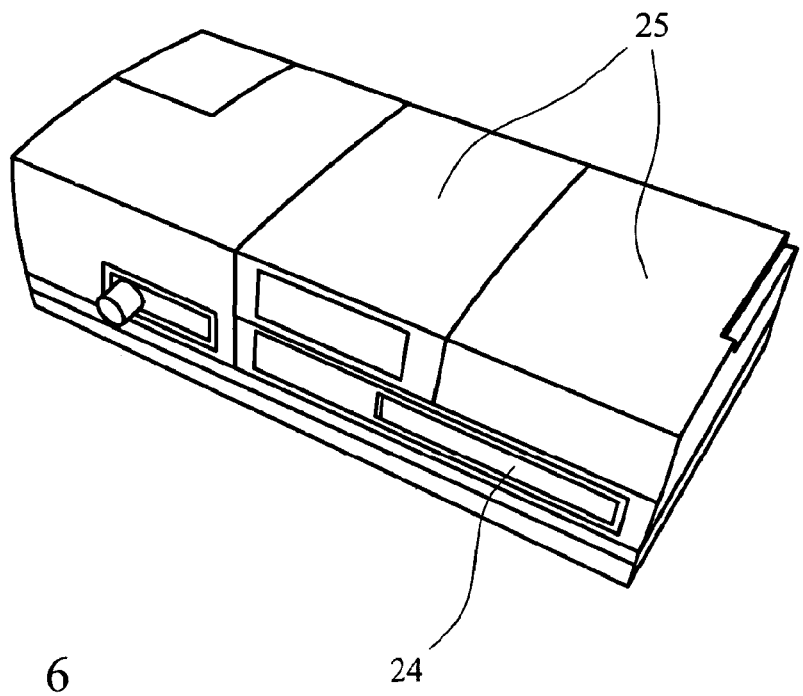
FIG. 6 shows an embodiment corresponding to FIG. 5 with a switch module in place of the Ethernet card.

In order to enable addition of these further functions, the next module to be connected is a switch module 24. If the basic Ethernet card 23 is present, it is first removed from the CPE. The switch module 24 is installed in a similar way to the Ethernet card 23 and connects to the power supply and Ethernet output 21 of the uplink module 20 and provided a number of Ethernet connection ports, typically eight ports. Typically two of these ports will be dedicated to specific functional modules as is described below. The remainder of the ports are provided with conventions connection sockets to allow Ethernet devices to be attached in the normal manner. With just the switch module 24 installed, the user is now provided with multiple connection ports for Ethernet devices. Dummy modules 25 can be provided as described above (see FIG. 6).

Figure 7:
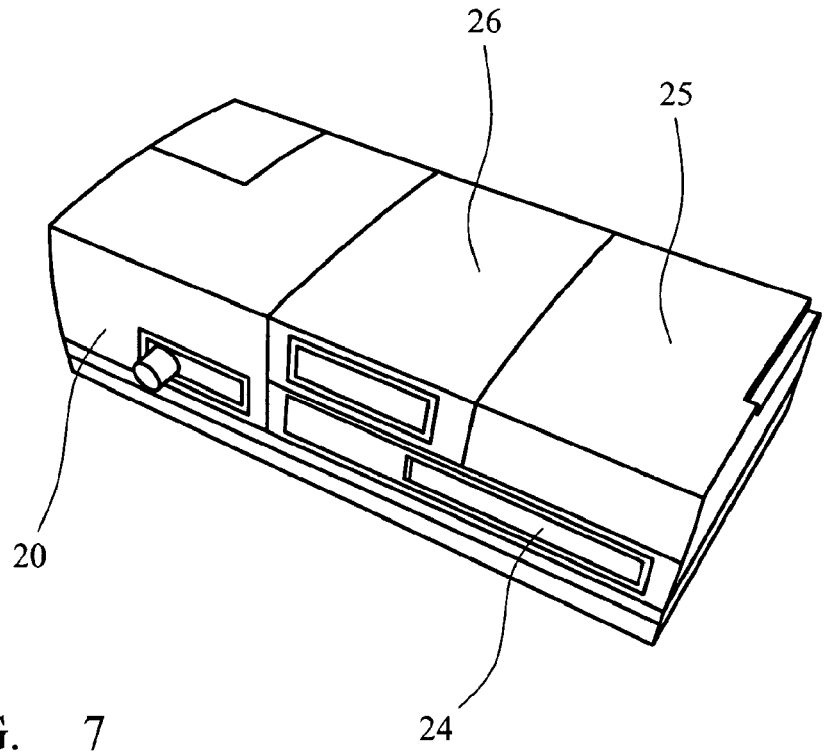
FIG. 7 shows a CPE corresponding to FIG. 6 with one of the dummy modules replaced by a voice over IP module.

One of the two dedicated Ethernet ports is arranged so that a voice over IP (VOIP) module 26 can be connected. The VOIP module 26 connects to the assigned Ethernet port on the switch module 24 and to the power supply of the uplink module 20 and is provided with a suitable connection for telephony devices. The VOIP module 26 converts the VOIP signals on the network to and from PSTN signals allowing conventional telephony devices to be used. To install the VOIP module 26, the appropriate dummy module is removed (if previously installed), and the VOIP module installed on the switch module 24 in its place. The remaining dummy module 25 can be installed (or left in place if previously installed) as is shown in FIG. 7.

Figure 8:
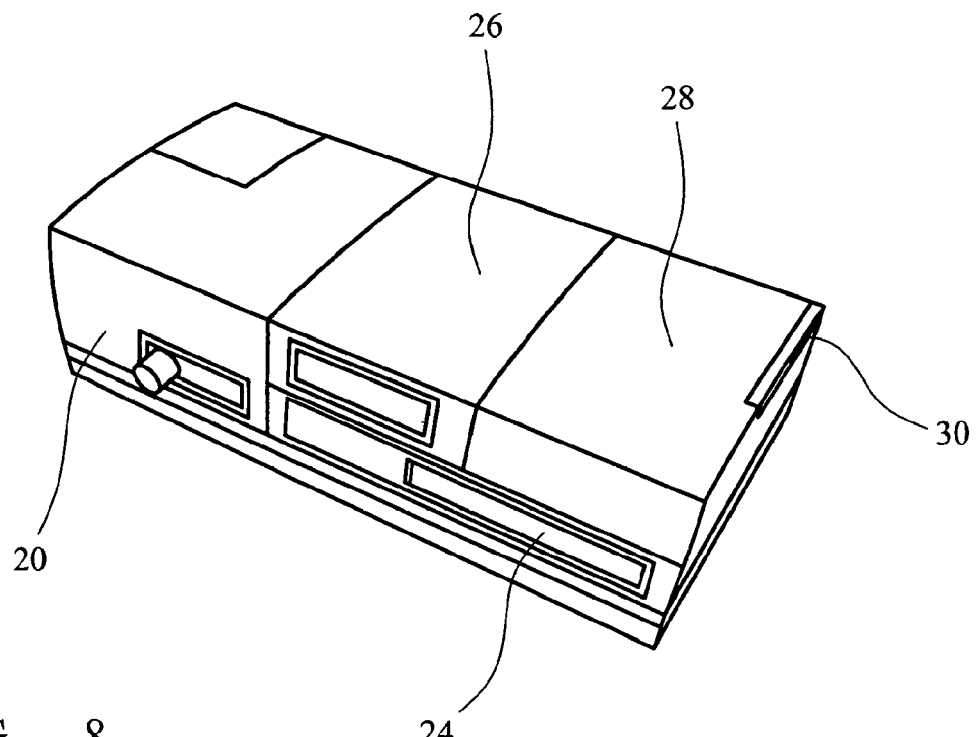
FIG. 8 shows a CPE corresponding to FIG. 6 with both of the dummy modules replaced by a voice over IP module and wireless module.

The other dedicated Ethernet port is arranged so that a wireless network module 28 can be installed. The wireless network module 28 similarly connects to the assigned Ethernet port of the switch module 24 and to the power supply of the uplink module 20 in a similar manner to the VOIP module 26 described above and is shown in FIG. 8. An antenna 30 is provided on the wireless module 28. The wireless network module converts the conventional Ethernet signals to and from wireless Ethernet signals to one or more wireless devices. The wireless module 28 can also be installed without the VOIP module 26, in which case a dummy module could be installed.

While the embodiments above have the various modules and dummy modules shown as the external configuration, it is also possible to install a main cover over the various modules with ports for the various connections.

Other dedicated module can be provided according to requirements. Also, the particular details of function described above can be varied. For example, the uplink module 20 can be used to terminate passive optical network (PON), active Ethernet FTTH (fibre to the home), or TP (cat 5)-based Ethernet.

Figure 9:
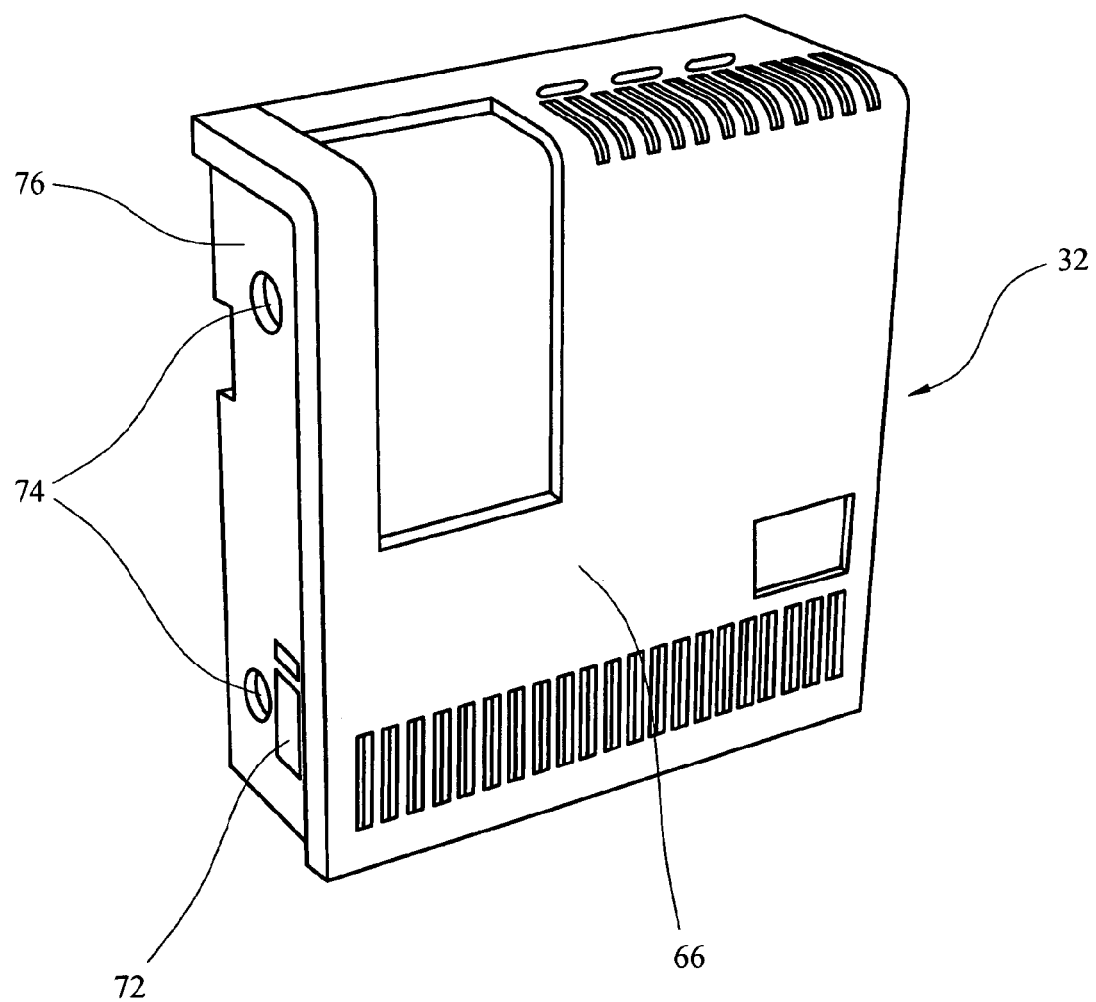
FIG. 9 shows a basic unit of a second embodiment of an apparatus according to the invention.
Figure 10:
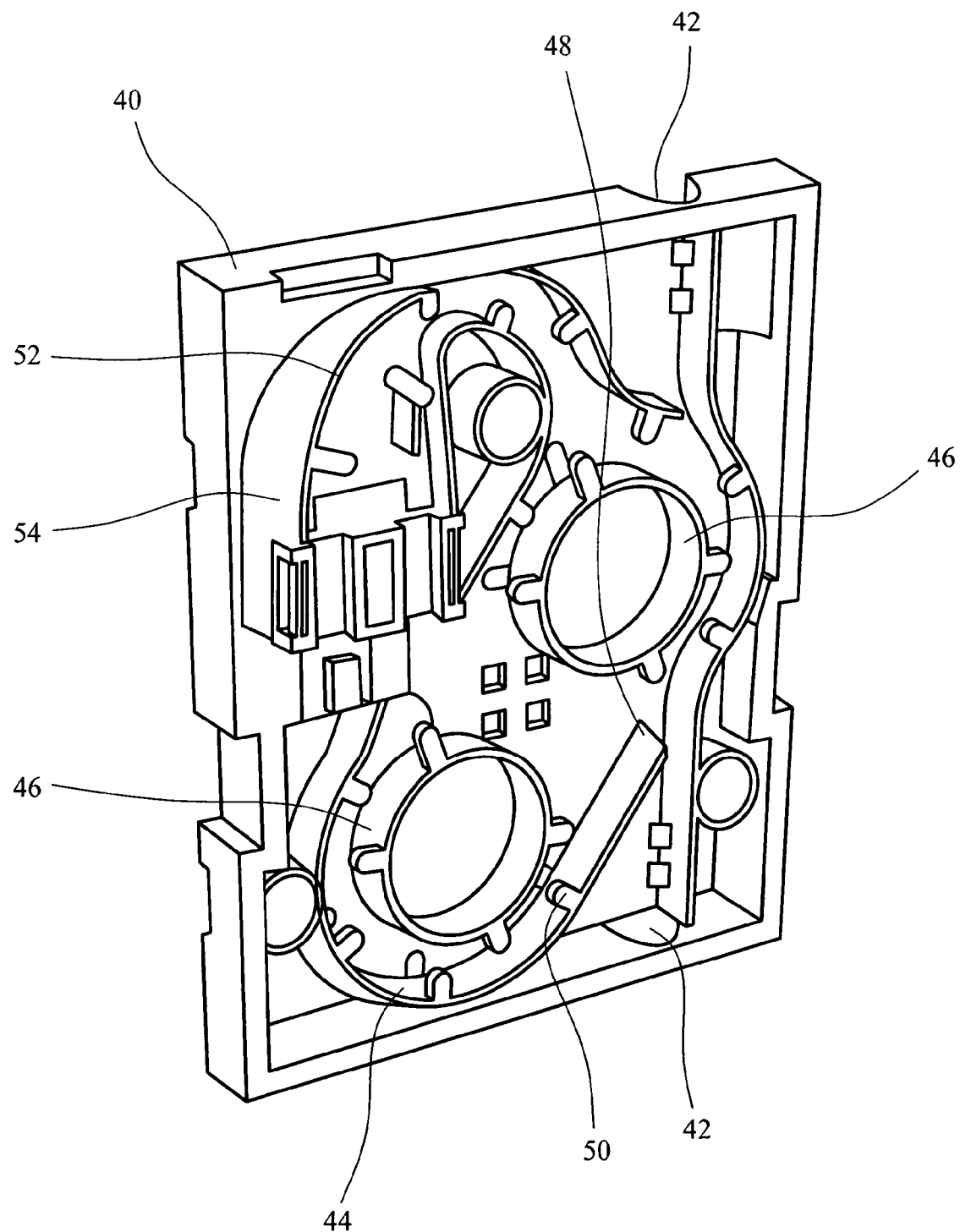
FIG. 10 shows a base used in the embodiment of FIG. 9.

FIG. 9 shows a perspective view of a second embodiment of an apparatus according to the invention. In this embodiment, a basic unit 32 is formed of a base 40 (chassis) and cover 34. The base 40 is shown in detail in FIG. 10. The base 40 is provided with various apertures 42 through which a cable can be lead to as to reach the interior of the unit. The base 40 is formed from a single-piece plastic moulding having a series of upstanding walls 44 defining turning points 46 and a channel 48. Tabs 50 are formed in the upper edge of the walls 44 so as to extend at least partly over the channel. One end of the channel comprises a ramp 52 that leads up to a location point 54 for a cable termination unit. The location point 54 includes slots 56 into which locating portions of the termination unit can be inserted. Adjacent the slots is provided a guide formation 58, the function of which is described in further detail below.

In use, the base 40 is attached to a supporting surface, such as a wall, by means of screws (not shown) in locating holes 60. The base 40 is typically positioned over or near the exit point of a communications cable such that the cable can be lead through one or other of the apertures 42. The can be can be wound around the turning points 46 so as to lie in the channel 48 with its end at the termination unit.

Figure 11:
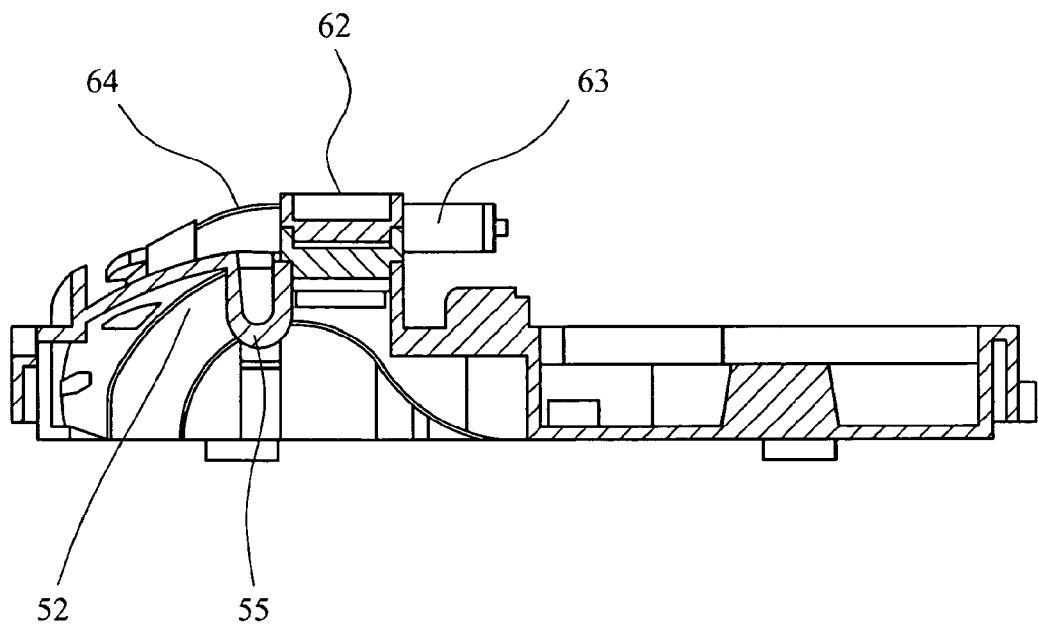
FIG. 11 shows further detail of the base shown in FIG. 10.
Figure 12:
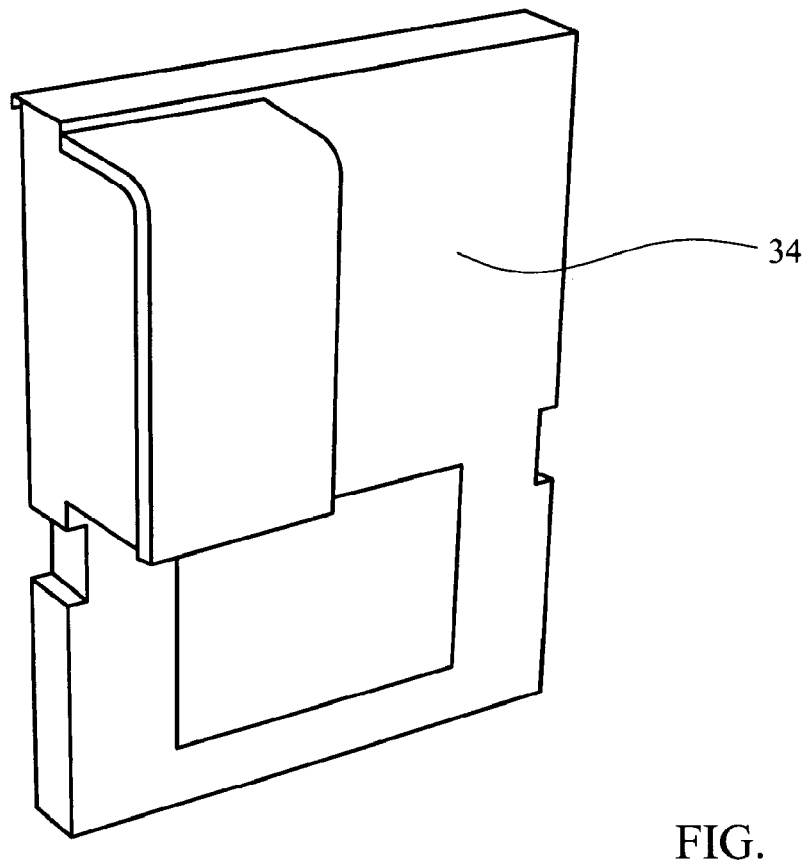
FIG. 12 shows the base of FIGS. 10 and 11 with a cover.

The termination unit includes a fitting 62 as shown in FIG. 11 into which the end fittings 63 of the cable 64 can be fixed. Locating legs extend from the fitting 62 and, in use, are inserted into the slots 56 such that the fitting 62 can be fixed at the end of the ramp 52. The location point 54 is connected to the rest of the base 40 by means of a spring portion 55 (see FIG. 11). The spring portion 55 gives the location point 54 a degree of movement in the axial direction of the cable.

Figure 13:
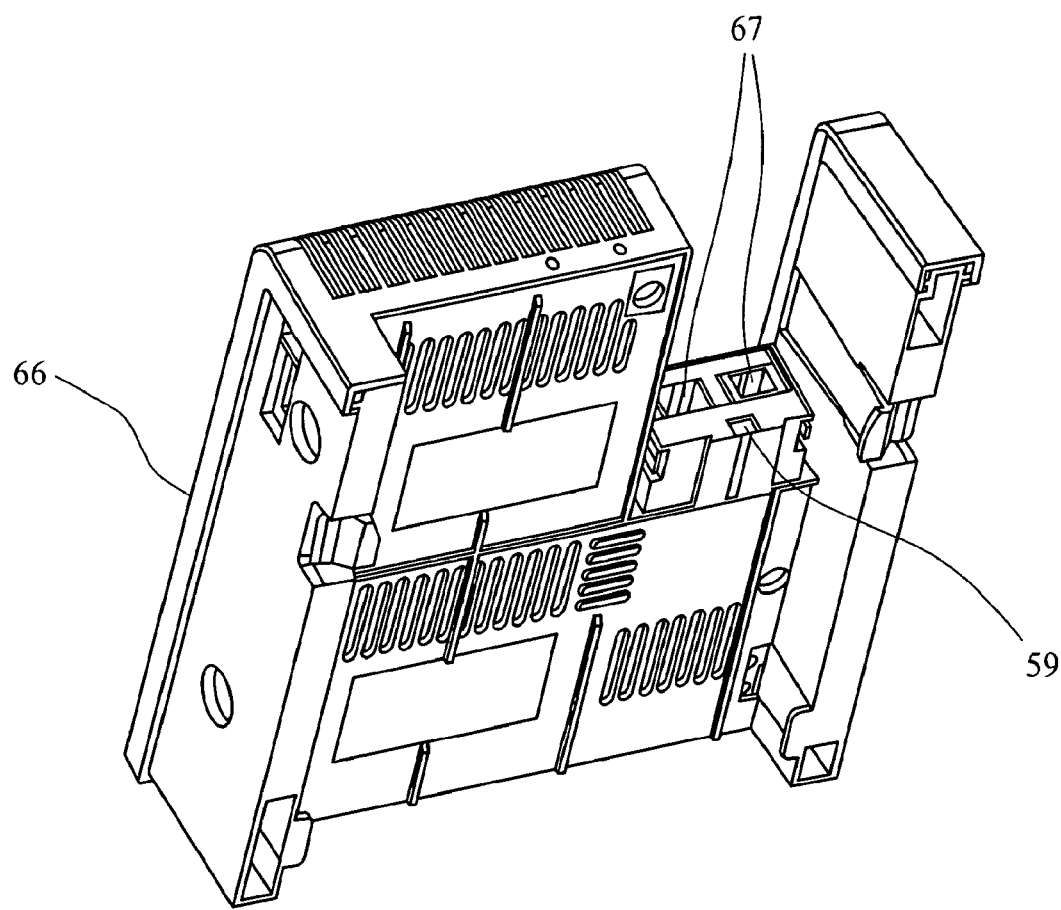
FIG. 13 shows the underside of an uplink module of the embodiment of FIG. 9.

When the cable end fittings 63 are fixed in the fitting 62, an uplink module 66 can be connected to the base 40 sliding the module over the cover 34. The uplink module 66 is provided with end connectors 67 which fit over the ends of the cable in the fitting 62. The guide formation 58 is in the form of a T-shaped ridge. This engages in a corresponding slot 59 in the underside of the module 66 (as is shown in FIG. 13) and acts to guide the connector 67 on the cable ends in the fitting 62, providing it with stability in its 'vertical' and 'lateral' directions as it is inserted. In this way, proper alignment is achieved and the uplink module 66 connected to provide basic network services.

By providing inter-engaging formations on the cover 34 and uplink module 66, the location of all parts can be precisely controlled except for the connection direction, where the spring 55 allows movement to accommodate tolerances of the parts making up the connection in that direction.

The basic unit can be provided with telephony, TV antenna and data switch functions with corresponding connections for user equipment. Further functional modules, for example for wireless network and VOIP can be connected in the manner described below.

Figure 14:
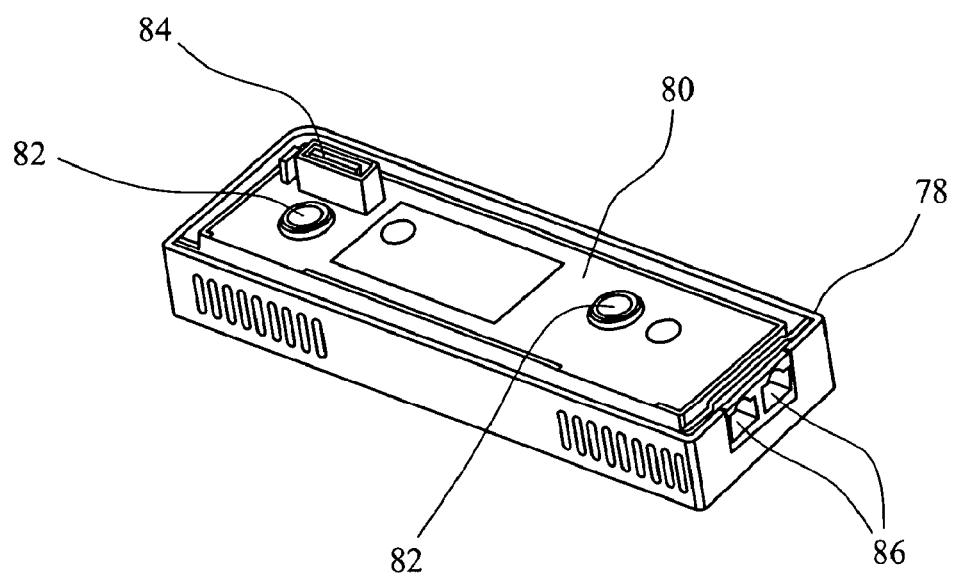
FIG. 14 shows a further functional module for attachment to the embodiment of FIG. 9.

The side surfaces 76 of the basic unit 32 are provided with a connector socket 72 and locating recesses 74. The further functional modules are provided in sub-housings 78, an example of which is shown in FIG. 14. The side surface 80 of the sub-housing 78 is provided with upstanding locating rings 82 which correspond in size and arrangement to the recesses 74 on the main unit. Likewise a plug connector 84 projects from the side surface 80, corresponding to the socket 72. Magnets (not shown) are located inside the sub-housing 78 adjacent the rings 82. Functional circuitry (also not shown) is located inside the sub-housing 78 and connects to the power and data supplies of the main unit via the connector 84. Further connector ports 86 can be provided on the sub-housing for connection of user equipment.

In use, the sub-housing 78 is brought up to the side of the basic unit 32 such that the rings 82 engage in the recesses 74 and the plug 84 engages in the socket 72. The magnets are attracted to the metal components forming part of the basic unit 32 (typically inside the uplink module 66), holding the further functional module in position. Detachment of the further functional module is achieved by simply pulling the sub-housing 78 away from the basic unit against the effect of the magnets.

Figure 15:
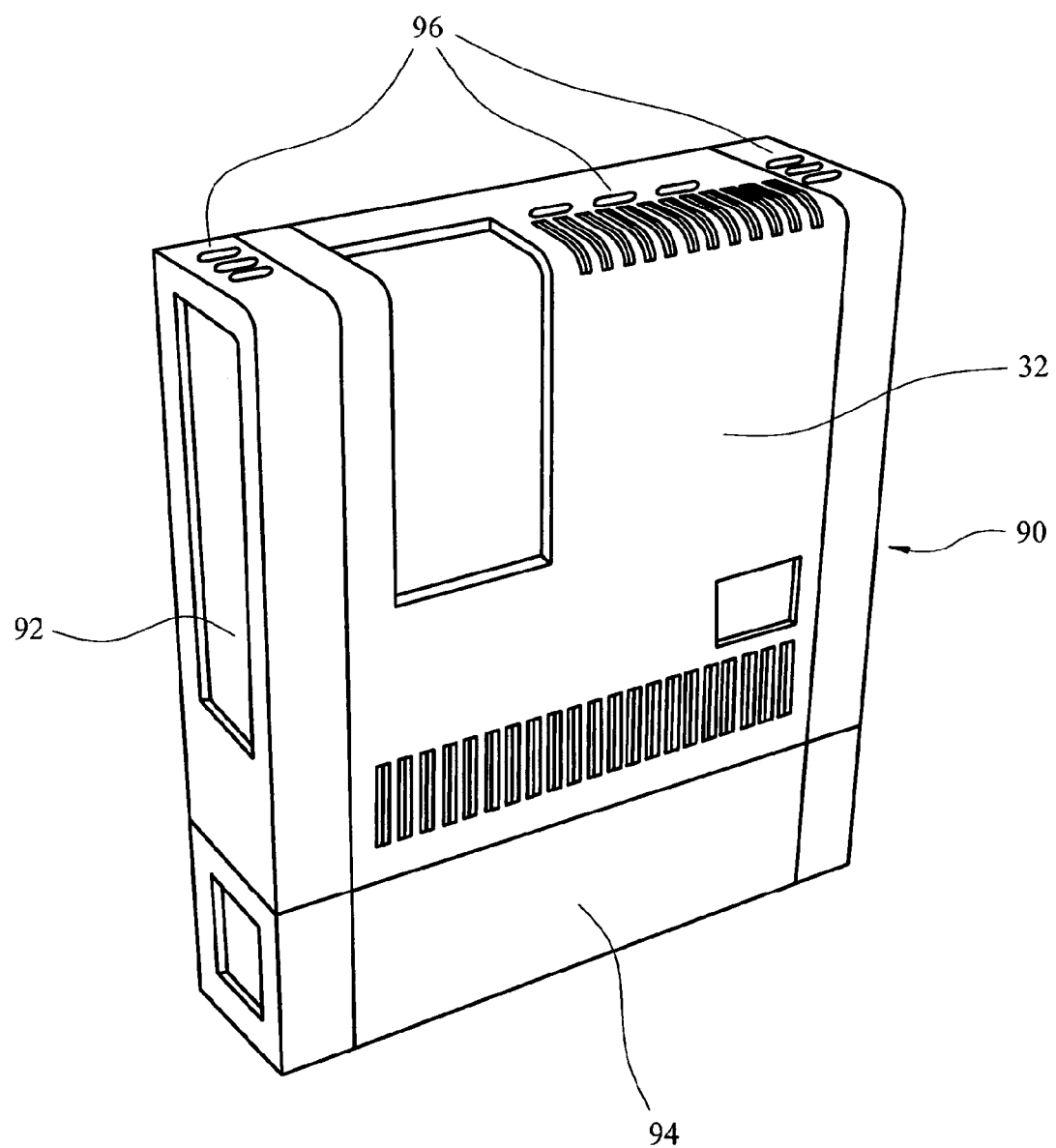
FIG. 15 shows an embodiment of the invention with two further functional modules as shown in FIG. 14 installed thereon.

Examples of suitable further functional modules include wireless network modules and VOIP modules. FIG. 15 shows an embodiment of the invention with two such further functional modules 90, 92 installed on a basic unit 32 together with an organiser fitting 94. The front surfaces of the modules 90, 92 and basic unit 32 can be provided with LEDs 96 to indicate functioning of the various components.

The modular nature of the apparatus according to the invention means that the various functional modules can be added or removed as the service provision to the residence changes. By simply bringing the sub-housing against the basic unit, each module can be attached, using the power and network connections provided. This also allows the network provider to avoid the cost of supplying all of the functional network modules ab initio. Thus the cost of providing the necessary hardware can be borne by the user and/or the service provider, lowering the up-front cost of providing network connection to premises. For example, the network owner might provide the base unit and uplink module as the basic network infrastructure, the subscriber might purchase the switch module so as to be able to extend use of the network connection to other devices (much as in the way that users buy routers for connection to ADSL services today) and the service provider(s) provide the VOIP and wireless modules as part of a service package. By providing the modular device with the common connections, it is possible to treat the CPE as a single device both physically and logically in network administration.

The invention claimed is:

1. Apparatus for connecting user equipment to a broadband network, comprising:
    a chassis including attachment points for connection to a supporting surface and a guide point to permit entry of a communication cable;
    a cable termination unit mounted on the chassis such that a cable led though the guide point can be connected and provided with a termination to which functional connections can be made; and
    a cover that is mounted on the chassis and is removable and reattachable to allow access to the chassis;
    wherein the chassis also includes mounting points for at least one functional module for connection to the communication cable and allowing different communication functions to be provided to user equipment connected to the network via the apparatus, and
    wherein the chassis comprises a base in which is formed an aperture defining the guide point through which the cable can enter and formations around which cable can be wound prior to being led to the cable termination unit.

2. Apparatus as claimed in claim 1, wherein the formations comprise upstanding walls forming turning points and an outer wall to define a channel leading to the cable termination unit such that when the chassis is attached with the aperture over a cable exiting the supporting surface, cable in excess of that needed to extend between the aperture and the cable termination unit can be wound around the formations in the channel.

3. Apparatus as claimed in claim 2, wherein the upper edge of the walls comprise tabs extending laterally over the channel to assist in retaining the cable therein.

4. Apparatus as claimed in claim 1, wherein the cable termination unit comprises a first part for providing connection between an end fitting on the functional module and the cable, and a second part configured to guide the end fitting into the first part.

5. Apparatus as claimed in claim 4, wherein the first part includes a spring formation to allow lateral movement to accommodate the end fitting.

6. Apparatus as claimed in claim 5, wherein the second part comprises a guide formation shaped so as to be engageable in a corresponding slot in the end fitting to ensure alignment of the end fitting with the first part.

7. Apparatus as claimed in claim 1, wherein the functional module comprises an uplink module to which further functional modules can connect for power and network connection so as to define a basic unit with the chassis, cover and cable termination unit.

8. Apparatus as claimed in claim 7, wherein the further functional modules include one or more of switch modules, voice over IP modules or wireless network modules.

9. Apparatus as claimed in claim 8, comprising magnetic connectors for mounting the further functional modules on the basic unit.

10. Apparatus as claimed in claim 8, wherein the magnetic connectors comprise magnets located in the further functional modules.

11. Apparatus as claimed in claim 9, wherein the magnetic connectors comprise inter-engaging shaped formations to hold the further functional module in place on the basic unit.

12. Apparatus as claimed in claim 9, comprising mounting points located at the sides of the basic unit.

13. Apparatus as claimed in claim 12, wherein the basic unit includes a functional connector located near to the mounting points by which the further functional module connects to the cable.

14. Apparatus as claimed in claim 13, wherein the functional connector comprises a socket in the basic unit into which a plug connector on the further functional module is inserted when the further functional module is held in place by the magnetic connectors.

15. A method of providing a broadband network connection to a location, comprising:
    (i) installing an apparatus on a supporting surface at the location, the apparatus comprising:
        a chassis including attachment points for connection to a supporting surface and a guide to permit entry of a communication cable;
        a cable termination unit mounted on the chassis such that a cable led through the guide point can be connected and provided with a termination to which functional connections can be made;
        a cover that is mounted on the chassis and is removable and reattachable to allow access to the chassis, the chassis also including mounting points for at least one functional module for connection to the communication cable and allowing different communication functions to be provided to user equipment connected to the network via the apparatus; and
        the chassis further comprising a base in which is formed an aperture defining the guide point through which the cable can enter and formations around which the cable can be wound prior to being led to the cable termination unit;

(ii) connecting a broadband network cable though the guide in the chassis to the cable termination unit;

(iii) subsequently connecting at least one functional module on the chassis via the mounting points and connecting user equipment to the cable via the functional module;

(iv) positioning the aperture over a cable exiting the support surface;

(v) leading the cable through the aperture;

(vi) winding the cable around the formations; and (vii) connecting the cable to the cable termination unit.

16. A method as claimed in claim 15, wherein the apparatus further includes magnetic connectors for mounting a further functional module on the basic unit comprising the chassis, cover and cable termination unit, the method further comprising connecting the further functional module to the basic unit by positioning the further functional module close to the basic unit such that the magnetic connectors act to attract the further functional module onto the basic unit and make a functional connection.

17. Apparatus for connecting user equipment to a broadband network, comprising:

a chassis including mounting points for functional modules including an uplink module and for switch, voice over IP and wireless network modules which also functionally connect to the uplink module for power and network connection;

a cable termination unit mounted on the chassis;

a cover that is mounted on the chassis and is easily removed to allow easy access to the chassis; and one or more place-holder modules for installing on the chassis when a corresponding functional module is not installed on the mounting points and that can be removed for installation of a corresponding functional module.

18. Apparatus as claimed in claim 17, further comprising one or more of an uplink module, a switch module, a voice over IP module or a wireless network module attached to the mounting points.

* * * * *